United States Patent
Lee

(10) Patent No.: US 7,260,754 B2
(45) Date of Patent: Aug. 21, 2007

(54) SEMICONDUCTOR DEVICE WITH SPEED BINNING TEST CIRCUIT AND TEST METHOD THEREOF

(75) Inventor: Hoi-Jin Lee, Seongnam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 372 days.

(21) Appl. No.: 10/720,123

(22) Filed: Nov. 25, 2003

(65) Prior Publication Data

US 2004/0133830 A1 Jul. 8, 2004

(30) Foreign Application Priority Data

Jan. 7, 2003 (KR) .............. 10-2003-0000839

(51) Int. Cl.
*G01R 31/28* (2006.01)
(52) U.S. Cl. .................. 714/724; 257/48; 331/57; 326/16
(58) Field of Classification Search .............. None
See application file for complete search history.

(56) References Cited

U.S. PATENT DOCUMENTS

| | | | | |
|---|---|---|---|---|
| 4,587,480 A | * | 5/1986 | Zasio | 324/310 |
| 6,133,582 A | * | 10/2000 | Osann et al. | 257/48 |
| 6,219,305 B1 | * | 4/2001 | Patrie et al. | 368/113 |
| 6,232,845 B1 | * | 5/2001 | Kingsley et al. | 331/57 |
| 6,437,597 B1 | * | 8/2002 | Chan | 326/16 |
| 6,477,115 B1 | * | 11/2002 | Inoshita et al. | 368/120 |
| 6,714,031 B2 | * | 3/2004 | Seki | 324/763 |
| 6,801,870 B2 | * | 10/2004 | Corr | 702/117 |
| 2002/0129310 A1 | * | 9/2002 | Shin | 714/727 |

FOREIGN PATENT DOCUMENTS

KR 1020000035411 6/2000

OTHER PUBLICATIONS

Korean Office Action, Notice to Submit Response, Jan. 20, 2005 (English translation provided).

* cited by examiner

*Primary Examiner*—Guy Lamarre
*Assistant Examiner*—John P. Trimmings
(74) *Attorney, Agent, or Firm*—Harness, Dickey & Pierce, P.L.C.

(57) ABSTRACT

A speed binning test circuit for a semiconductor device may include a plurality of circuit groups arranged along a boundary of a chip circuit. Each circuit group may include a different number of unit delay circuits that may form a chain structure. The speed binning test circuit may also include a plurality of pads. Each pad may be arranged between a pair of circuit groups so that at least one output terminal of a unit delay circuit of one of the plurality of circuit groups is connected to one of the pads. The speed binning test device performs a speed binning test method in which a signal through the circuit groups is delayed, and on-chip-variations are monitored to determine a total signal delay time through the chain structure.

22 Claims, 2 Drawing Sheets

SEMICONDUCTOR DEVICE WITH SPEED BINNING TEST CIRCUIT AND TEST METHOD THEREOF

This application claims the priority of Korean Patent Application No. 2003-839, filed on Jan. 7, 2003 in the Korean Intellectual Property Office, the disclosure of which is incorporated herein in its entirety by reference.

BACKGROUND OF THE INVENTION

1. Field of the Invention

The present invention relates to a semiconductor device with a speed binning test circuit and a test method thereof.

2. Description of the Related Art

In general, semiconductor memory devices such as a Dynamic Random Access Memory (DRAM) and an Application-Specific Integrated Circuit (ASIC) are manufactured by a series of processes. These processes may include a design process, a manufacture process, a chip test process, and a packaging process, before the semiconductor memory devices enter the marketplace. One type of chip test process is referring to as a speed binning test. A speed binning test is one of a series of processes performed after the manufacture process. In high-performance semiconductor memory devices such as those described above, a significant effect of temperature variation during testing is to affect the assessed maximum speed of the device in normal use, known as "speed binning". In a speed binning test, operation speeds of chips may be measured at a wafer-level, and poor-quality chips or wafers may be sorted out based on the result of measurement.

The operation speeds of semiconductor integrated circuits such as central processing units (CPUs), which are manufactured through an ultra-fine process, rely largely on process variations. Thus, there is a need for monitoring on-chip variations at a wafer level using the speed-binning test, and then predicting the operation features of chips, prior to placing the chips in the marketplace. Accordingly, packaging costs may be reduced. Typically, product costs for packaging a device such as a high-performance CPU is expensive, and the practical utility of working dies is determined primarily by the dies' functional working at a desired speed, rather than the dies' functional working. Therefore, it is more desirable to perform the speed-binning test at the wafer level to sort out poor-quality wafers.

In a conventional speed binning test circuit, a Boundary Scan Register (BSR) installed within the chip may be used to measure turn-around time by using an inverter chain installed around the chip. The turn-around time indicates a delay time duration until an input signal is output. Turn-around time is used for estimating the operation speed of the chip after the packaging process. That is, the range of the chip operation speed may be estimated using tracking plots that are measured based on a correlation between the turn-around time from the inverter chain, and the chip operation speed. The speed-binning test described above is disclosed in U.S. patent application Ser. No. 20020,129,310A1.

A conventional speed binning test method of measuring turn-around time is based on the fact that the operation speed of chip (using the inverter chain and DC characteristics evaluated through a Test Element Group (TEG), for example) depend largely on process variations.

However, as process conditions become more minute and on-chip variations become more serious, it is difficult to accurately predict the operation speed of chip by only using the conventional inverter chain to measure the turn-around time after the packaging process. In other words, the influences of on-chip variations upon circuits at every possible location, e.g., upper, lower, left and right portions, over the chip are represented as a data value, which may be referred to as a 'total delay value', in the inverter chain. It is impossible to accurately predict the operation speed based only on the total delay time. For example, it is difficult to determine whether (i) circuits at the every possible location over the chip are affected uniformly by the on-chip variations, or (ii) only a circuit at a particular location is largely affected by the on-chip variations. Thus, it may be difficult to explain why the operation speed of a core circuit becomes slower when the turn-around time for the latter case (ii) equals turn-around time for the former case (i).

Also, in the conventional speed binning test method, influence of on-chip variations is evaluated by manually measuring operation speeds at a number of different locations in the inverter chain (which is installed around the core circuit), using test equipment. The results of these measurements are then stored in a database. However, considerable time is spent on manual evaluation of the operation speed, thus making it difficult to measure the operation speeds of all of chips on a wafer. Accordingly, in the above test method only a few wafers of a lot are selected, and the evaluation is performed on only a few chips of the selected wafers. A distribution of measurement results become wide, as process conditions become even more minute. Thus, these measurement results are not accurate enough to represent the performance of the all chips on a wafer.

SUMMARY OF THE INVENTION

Exemplary embodiments of the present invention are directed to a speed binning test circuit that may include a plurality of circuit groups arranged along a boundary of a chip of a semiconductor device. Each circuit group may include a different number of unit delay circuits that may form a chain structure on the chip. The speed binning test circuit may also include a plurality of pads. Each pad may be arranged on the chip between a pair of circuit groups so that at least one output terminal of a unit delay circuit of one of the plurality of circuit groups is connected to one of the pads. The speed binning test device may perform a speed binning test method in which a signal through the circuit groups is delayed, and on-chip-variations are monitored to determine a total signal delay time through the chain structure.

BRIEF DESCRIPTION OF THE DRAWINGS

Exemplary embodiments of the present invention will become more fully understood from the detailed description herein below and the accompanying drawings, wherein like elements are represented by like reference numerals, which are by way of illustration only and thus do not limit the exemplary embodiments of the present invention and wherein.

DETAILED DESCRIPTION OF THE EXEMPLARY EMBODIMENTS

Figure 1:
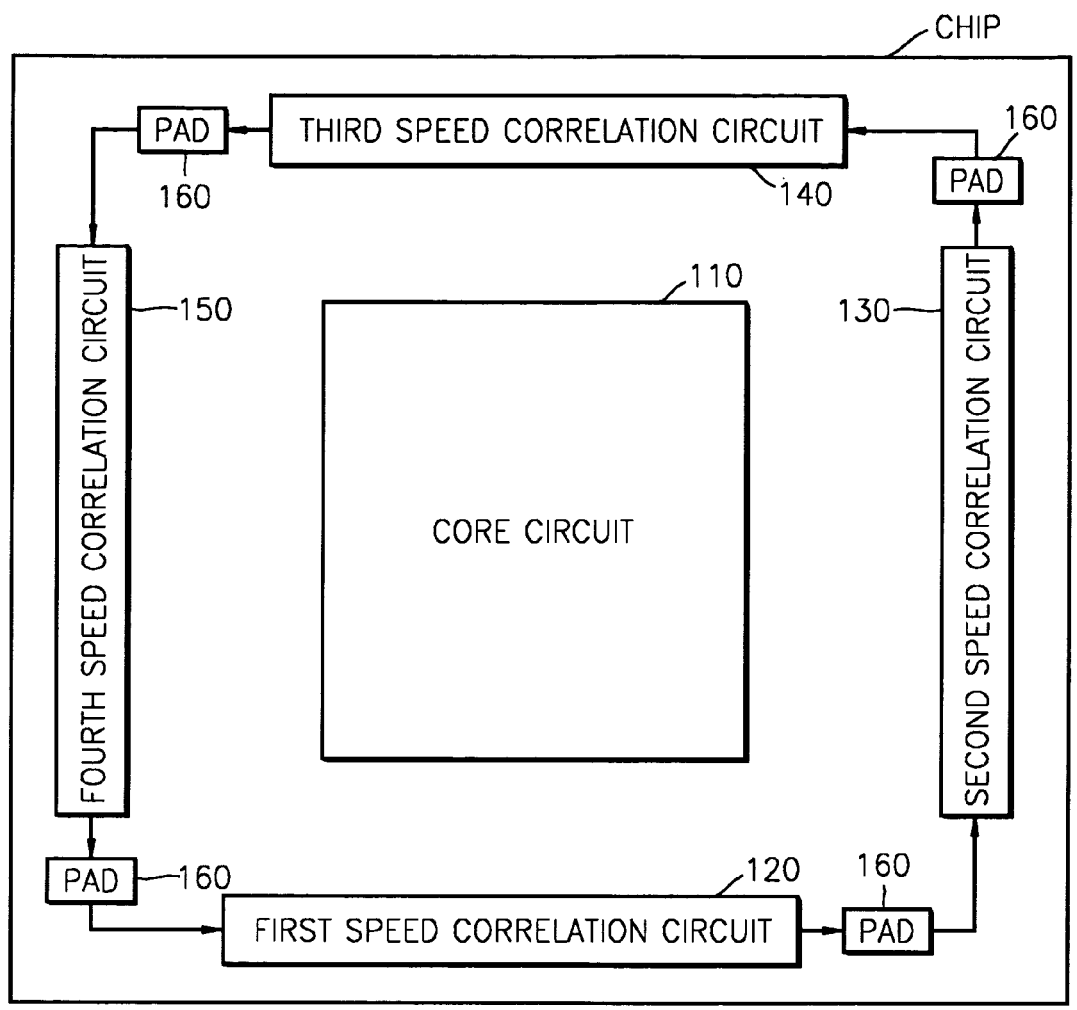
FIG. 1 is a block diagram illustrating a structure of a semiconductor device with a speed binning test circuit according to an exemplary embodiment of the present invention.

Hereinafter, exemplary embodiments of the present invention will be described in detail with reference to the accompanying drawings. The same reference numerals represent the same elements throughout the drawings.

FIG. 1 is a block diagram illustrating a structure of a semiconductor device with a speed binning test circuit that performs a speed-binning test, according to an exemplary embodiment of the present invention. Referring to FIG. 1, the semiconductor device, which in FIG. 1 is embodied as a chip, for example, may include a plurality of signal input/output (I/O) pins 101-108, which are the same as those installed in a general semiconductor device, for example. Signals may be input to the signal I/O pins 101-108 from a core circuit 110, and/or signals may be output from the signal I/O pins 101-108 to the core circuit 110. The core circuit 110 performs given functions using its logic circuit and receives/outputs signals from/to the plurality of signal I/O pins 101-108.

A speed binning test circuit is arranged around core circuit 110. The speed binning test circuit includes a plurality of (known) unit delay circuits (hereafter 'unit delay circuits' for clarity) and a plurality of pads. As shown in FIG. 1, the unit delay circuits may be categorized into four groups (first through fourth groups). These four groups may be represented as first speed correlation circuit 120, second speed correlation circuit 130, third speed correlation circuit 140 and fourth speed correlation circuit 140. The first through fourth groups may be arranged along the boundary of the core circuit 110 in a chain structure, for example. The total number of unit delay circuits within each of the respective first through fourth groups may be different. For example, the ratio of the numbers of unit delay circuits in each of the four groups may be expressed as follows in equation (1):

$$A:B:C:D = a:b:c:d \quad (1).$$

In equation (1), A denotes a number obtained by subtracting 1 from the number of unit delay circuits of the first group; B denotes the number of unit delay circuits of the second group; C denotes the number of the unit delay circuits of the third group; D denotes the number of the unit delay circuits of the fourth group. The parameters a, b, c, and d may be any different numbered coefficients.

In the speed binning test circuit, the first speed correlation circuit 120 may include a plurality of serially-connected unit delay circuits that constitute the first group. The first speed correlation circuit 120 delays a final delay signal received from fourth speed correlation circuit 150, via pad 160, and outputs the delayed final delay signal as a first delay signal. The second speed correlation circuit 130 may include a plurality of serially-connected unit delay circuits that constitute the second group. The second speed correlation circuit 130 delays the first delay signal and outputs the delayed first delay signal as a second delay signal. The third speed correlation circuit 140 includes a plurality of serially-connected unit delay circuits that constitute the third group. The third speed correlation circuit 140 delays the second delay signal and outputs the delayed second delay signal as a third delay signal. The fourth speed correlation circuit 150 includes a plurality of serially-connected unit delay circuits that constitute the fourth group. The fourth speed correlation circuit 150 delays the third delay signal and outputs the delayed first signal as the final delay signal. Each of a plurality of pads 160 is connected to at least one output terminal of the unit delay circuit of the first through fourth groups, respectively.

The first through third delay signals and the final delay signal have the same oscillation waveforms after a given time. The given time is a total signal delay time Dt delayed in the chain formed by the unit delay circuits of the first through fourth groups.

Figure 2:
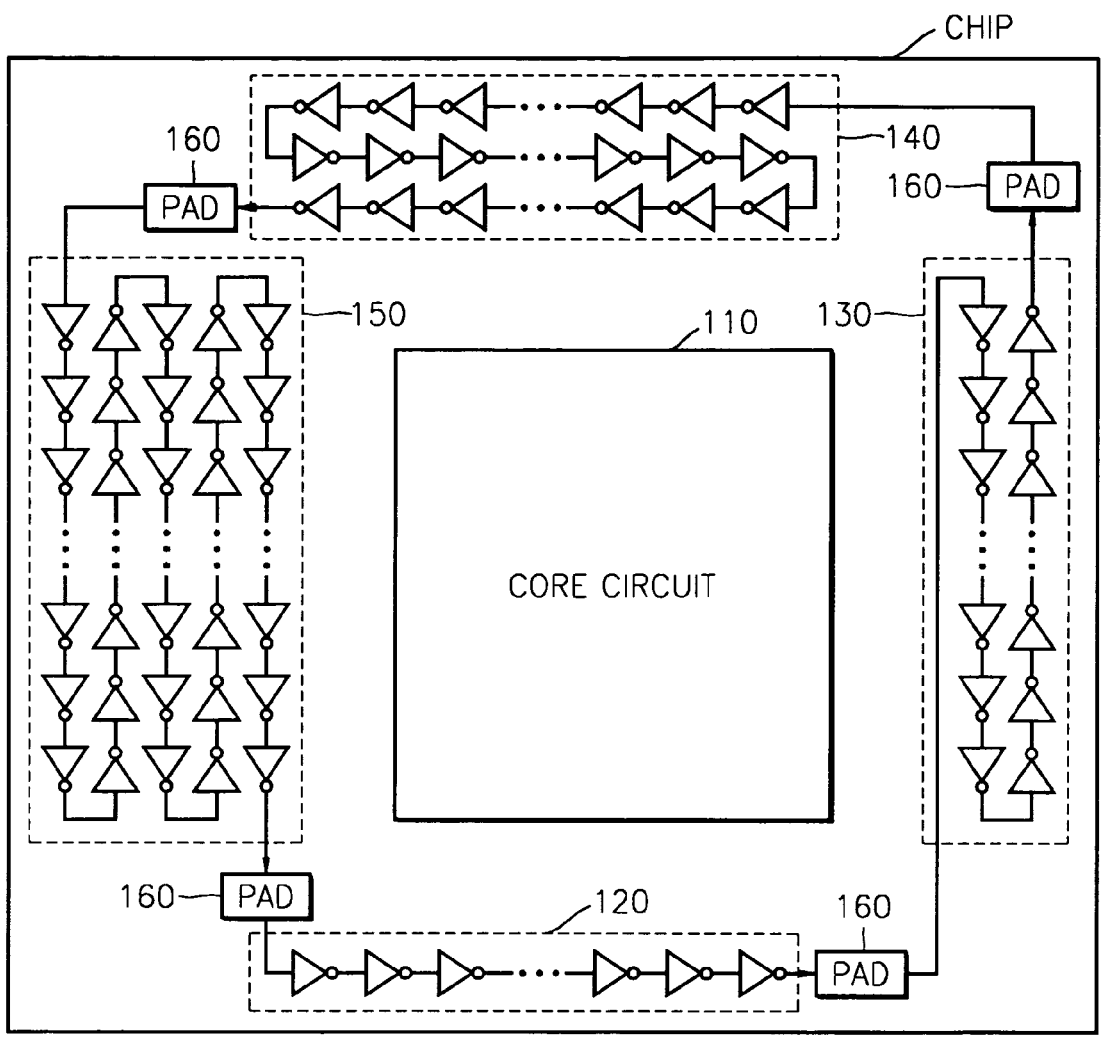
FIG. 2 is a block diagram illustrating speed correlation circuits shown in FIG. 1.

FIG. 2 is an exemplary block diagram of the first through fourth speed correlation circuits 170 through 150 shown in FIG. 1. Referring to FIG. 2, the first through fourth speed correlation circuits 120 through 150 are installed in a chain structure around the boundary of core circuit 110 and include given (known or determined in advance) unit delay circuits, i.e., inverter circuits. However, the unit delay circuits according to the exemplary embodiments of the present invention are not limited to inverter circuits. The unit delay circuits may embodied as any circuit capable of inverting input signals and outputting an inverted signal, and/or as buffers capable of outputting signals having the same phases as signals input thereto. However, if the unit delay circuits are buffers, at least one of the unit delay circuits should be an inverter circuit so that the chain structure can operate as a ring oscillator.

The speed correlation circuits 120 through 150 form four groups of unit delay circuits, i.e., inverter circuits. The total numbers of inverter circuits in a given group may be different then numbers in another group, the ratio of which as shown in equation (1).

Referring to FIG. 2, the number of inverter circuits of the first group are represented as (N+1); those of the second group as 2N, those of the third group as 3N, and those of the fourth group as 5N. The number of inverter circuits in first group is set at N+1 so that the total number of inverter circuits in all four groups is an odd number. By having an odd number of total inverter circuits, the chain structure may act as a ring oscillator. The ratio of numbers of inverter circuits of the first through fourth groups may be approximately 1N:2N:3N:5N when N may be several tens or several hundreds of inverter circuits. The parameters a, b, c, and d of equation (1) may be any numbers, so long as the numbers are different from each other. It may be easier to evaluate the influence of on-chip variations if a, b, c, and d are set as different prime numbers.

Assuming that a signal delay time delayed in the first speed correlation circuit 120 is D, signal delay times in the second through fourth speed correlation circuits 130 through 130 are approximately 2D, 3D, and 5D, respectively. A 'derating factor' is a value that indicates the degree of influence of on-chip variations to the operation speed of a circuit. If the derating factors of the first through fourth speed correlation circuits 120 through 150 are the same, a total signal delay time 'Dt' in the first through fourth speed correlation circuits 120 through 150 may be computed as follows by equation (2):

$$Dt \approx D + 2D + 3D + 5D \quad (2)$$

If the degrees, i.e., the derating factors, of the influence of on-chip variations upon the operation speeds of the first through fourth speed correlation circuits 120 through 150 are different from one another, the total signal delay time Dt may be calculated as follows using equations (3) or (4):

$$Dt \approx 0.9D + 1.1*(2D) + 3D + 5D \quad (3)$$

$$Dt \approx 0.9D + 1.1*(2D) + 1.4*(3D) + 0.6*(5D) \quad (4)$$

However, the computation of total signal delay time Dt is not limited to calculations performed by equations (3) and (4); rather, the computation of Dt varies, depending on on-chip variations.

Referring to equations (2) through (4), the total signal delay time Dt related to the same derating factors is not the same as the total signal delay time Dt related to different derating factors. If a, b, c, and d of equation (1) are different prime numbers, it is easier to evaluate the influence of the on-chip variations. In other words, since a, b, c, and d may only be evenly divided by 1 or by itself, it may be easier to determine the correlation among the total signal delay time Dt and the derating factors of the speed correlation circuits 120 through 150.

The conventional speed binning test method evaluates an operation speed merely by measuring a turn-around time using an inverter chain formed with inverter chain groups having the same number of inverter circuits in each group. For this reason, it is difficult to determine, using the conventional speed binning test method, whether circuits at the every possible location over the chip are uniformly affected by on-chip variations, or if only a circuit at a particular location is affected by the on-chip variation. This is because signal delay times Dt are the same for the above two cases.

In accordance with the exemplary embodiments of the present invention, however, the numbers of the inverter circuits in each of the first through fourth groups are different. Therefore, the extent of the influence of on-chip variations (i.e., the derating factors) on circuits at various locations in the chip may be more easily and individually determined, since total signal delay time Dt is measured only once. Further, the exemplary embodiments of the present invention may make it easier to monitor circuits at several locations on a timing-critical chip, so as to determine those circuits on the chip that may be substantially affected by on-chip variations.

Figure 3:
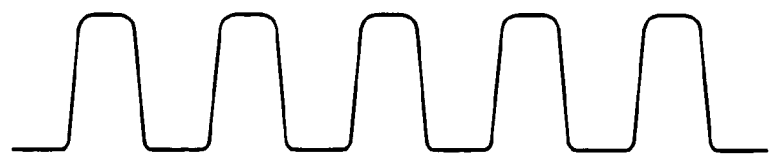
FIG. 3 illustrates an oscillation waveform used when measuring the operation speeds of the speed correlation circuits shown in FIG. 2.

FIG. 3 illustrates an oscillation waveform used when measuring the operation speeds of the speed correlation circuits shown in FIG. 2. The oscillation waveform shown in FIG. 3 may be observed by probing signals output from the pads 160 using probe cards and an oscilloscope. Each pad 160 is connected to at least one output terminal of the unit delay circuits of the four groups, respectively.

The first through fourth speed correlation circuits 120 through 150 may be connected to one another in a chain structure so as to act as a ring oscillator, for example. Thus, the first through third delay signals (and the final delay signal), have the same oscillation waveforms after a given time. The given time is a total signal delay time delayed in the chain structure formed from the unit delay circuits of the four groups. The total signal delay time Dt in the first through fourth speed correlation circuits 120 through 150 may be computed using the frequency of the signal waveform, shown in FIG. 3, which is obtained by probing signals output from pads 160. If the frequency of the signal waveform is f, the total signal delay time Dt can be expressed as by equation (5), for example:

$$Dt=1/(2f) \qquad (5)$$

As described above, in a semiconductor device according to an exemplary embodiment of the present invention, a speed binning test circuit may be provided for performing a speed binning test procedure. Generally, the test method includes delaying a signal through each successively connected circuit groups ('group'), where each group includes a different number of unit delay circuits that form of a chain structure, and monitoring on-chip-variations to determine total signal delay time delayed in the chain structure. Each group may include a given different number of unit delay circuits, as discussed above. On-chip variations may be monitored by observing an oscillation waveform of signals output from each of the pads, where each pad is connected to at least one output terminal of the unit delay circuits of the four groups, respectively.

As described above, an inverter chain in accordance with the exemplary embodiments of the present invention may be constructed differently from a conventional inverter chain. Thus, one-time measurement of total signal delay time Dt allows measurement of the degrees, i.e., derating factors, of the influence of on-chip variations upon the operation speeds of circuits installed at a variety of locations, e.g., upper, lower, left, and right portions, on the chip. Also, the speed binning circuit and test method in accordance with the exemplary embodiments of the present invention may facilitate monitoring of on-chip variations in operation speeds of circuits at a plurality of locations on a timing-critical chip. Accordingly, this may improve the accuracy in sorting out circuits on the chip that may be substantially adversely affected by the on-chip variations, so as to minimize error in predicting operation speed of a chip. This may help to reduce product costs, and provide a more efficient way to evaluate the influence of the on-chip variations in chips of entire wafers in a lot.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A speed binning test circuit, comprising:
a plurality of circuit groups arranged along a boundary of a chip circuit, each circuit group including a different number of unit delay circuits with respect to each other;
a plurality of pads, each pad disposed between two adjacent circuit groups of the plurality of circuit groups, wherein each of the pads is connected to at least one output terminal of one of the two adjacent circuit groups and also connected to at least one input terminal of the other of the two adjacent circuit groups; and
wherein the circuit groups comprise combinational circuits.

2. The speed binning test circuit of claim 1, wherein the plurality of circuit groups include:
a first speed correlation circuit in which unit delay circuits of a first group are serially-connected to one another for delaying a received final delay signal and outputting a first delay signal;
a second speed correlation circuit in which unit delay circuits of a second group are serially-connected to one another for delaying the first delay signal and outputting a second delay signal;
a third speed correlation circuit in which unit delay circuits of a third group are serially-connected to one another for delaying the second delay signal and outputting a third delay signal; and
a fourth speed correlation circuit in which unit delay circuits of a fourth group are serially-connected to one another for delaying the third delay signal and outputting the final delay signal that is received by the first group of unit delay circuits.

3. The speed binning test circuit of claim 2, wherein the first through third delay signals, collectively, and the final delay signal have the same oscillation waveforms after a given time.

4. The speed binning test circuit of claim 3, wherein the given time represents a total signal delay time of a signal delayed through the first through fourth groups.

5. The speed binning test circuit of claim 1, wherein the ratio of numbers of unit delay circuits of the plurality of circuit groups are expressed by:

$$A:B:C:D=a:b:c:d,$$

wherein A denotes a number obtained by subtracting 1 from the numbers of unit delay circuits of a first group; B denotes the number of Unit delay circuits of a second group; C denotes the number of unit delay circuits of a third group; D denotes a number of unit delay circuits of the fourth group, and wherein a, b, c, and d represent different valued coefficients.

6. The speed binning test circuit of claim 5, wherein a, b, c, and d are different prime numbers.

7. The speed binning test circuit of claim 1, wherein the unit delay circuits are inverter circuits.

8. A semiconductor device, comprising:
a plurality of signal input/output pins;
a core circuit including logic that receives or outputs a signal via the plurality of signal input/output pins; and
a speed binning test circuit including:
a plurality of circuit groups, each circuit group including a different number of unit delay circuits with respect to each other arranged in a chain structure along the boundary of the core circuit,
a plurality of pads, each pad disposed between two adjacent circuit groups of the plurality of circuit groups, wherein each of the pads is connected to at least one output terminal of one of the two adjacent circuit groups and also connected to at least one input terminal of the other of the two adjacent circuit groups;and
wherein the circuit groups comprise combinational circuits.

9. The semiconductor device of claim 8, wherein the speed binning test circuit comprises:
a first speed correlation circuit in which unit delay circuits of a first group are serially-connected to one another for delaying a received final delay signal and outputting a first delay signal;
a second speed correlation circuit in which unit delay circuits of a second group are serially-connected to one another for delaying the first delay signal and outputting a second delay signal;
a third speed correlation circuit in which unit delay circuits of a third group are serially-connected to one another for delaying the second delay signal and outputting a third delay signal; and
a fourth speed correlation circuit in which unit delay circuits of a fourth group are serially-connected to one another for delaying the third delay signal and outputting the final delay signal that is received by the first group of unit delay circuits.

10. The semiconductor device of claim 9, wherein the first through third delay signals, collectively, and the final delay signal have the same oscillation waveforms after a given time.

11. The semiconductor device of claim 10, wherein the given time represents a total signal delay time of a signal delayed through the first through fourth groups.

12. The semiconductor device of claim 8,
wherein the ratio of numbers of unit delay circuits of the plurality of circuit groups are expressed by:

$$A:B:C:D=a:b:c:d,$$

wherein A denotes a number obtained by subtracting 1 from the numbers of unit delay circuits of a first group; B denotes the number of unit delay circuits of a second group; C denotes the number of unit delay circuits of a third group; D denotes a number of unit delay circuits of the fourth group, and wherein a, b, c, and d represent different valued coefficients.

13. The semiconductor device of claim 12, wherein a, b, c, and d are different prime numbers.

14. The semiconductor device of claim 8, wherein the unit delay circuits are inverter circuits.

15. A speed binning test method, comprising: delaying test signals through a plurality of successively connected circuit groups, each of the plurality of successively connected circuit groups including different number of unit delay circuits with respect to each other, that forms a chain structure on a chip,
monitoring on-chip-variations to determine total signal delay time through the chain structure at a plurality of pads, each pad disposed between two adjacent circuit groups of the plurality of circuit groups, wherein each of the pads is connected to at least one output terminal of one of the two adjacent circuit groups and also connected to at least one input terminal of the other of the two adjacent circuit groups; and
wherein the circuit groups comprise combinational circuits.

16. The method of claim 15, further comprising receiving the test signals from the circuit groups on the chip via a plurality of signal input/output pins.

17. The method of claim 15, wherein the delaying step further includes:
first delaying a received final delay signal and outputting a first delay signal in a first group of the plurality of successively connected circuit group;
second delaying the first delay signal and outputting a second delay signal in a second group of the plurality of successively connected circuit group;
third delaying the second delay signal and outputting a third delay signal in a third group of the plurality of successively connected circuit group; and
fourth delaying the third delay signal and outputting the final delay signal that is received by the first group in a fourth group of the plurality of successively connected circuit group.

18. The method of claim 17, wherein the monitoring step further includes monitoring on-chip variations by measuring oscillation waveforms.

19. The method of claim 18, wherein the first through third delay signals, collectively, and the final delay signal have the same oscillation waveforms after a given time.

20. The method of claim 19, wherein the given time represents a total signal delay time of a signal delayed through the first through fourth groups.

21. The method of claim 15,
wherein the ratio of numbers of unit delay circuits of the plurality of circuit groups are expressed by:

$$A:B:C:D=a:b:c:d,$$

wherein A denotes a number obtained by subtracting 1 from the numbers of unit delay circuits of a first group; B denotes the number of unit delay circuits of a second group; C denotes the number of unit delay circuits of a third group; D denotes a number of unit delay circuits of the fourth group, and wherein a, b, c, and d represent different valued coefficients.

22. The method of claim 21, wherein a, b, c, and d are different prime numbers.

* * * * *